(12) United States Patent
Hovel

(10) Patent No.: US 8,916,769 B2
(45) Date of Patent: Dec. 23, 2014

(54) TANDEM NANOFILM INTERCONNECTED SEMICONDUCTOR WAFER SOLAR CELLS

(75) Inventor: Harold J. Hovel, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 288 days.

(21) Appl. No.: 12/246,511

(22) Filed: Oct. 7, 2008

(65) Prior Publication Data

US 2010/0083999 A1    Apr. 8, 2010

(51) Int. Cl.

| | |
|---|---|
| H01L 31/04 | (2014.01) |
| H01L 31/0352 | (2006.01) |
| B82Y 20/00 | (2011.01) |
| H01L 31/0687 | (2012.01) |
| H01L 31/0236 | (2006.01) |
| H01L 31/052 | (2014.01) |
| H01L 31/0693 | (2012.01) |

(52) U.S. Cl.
CPC .... *H01L 31/0236* (2013.01); *H01L 31/035236* (2013.01); *B82Y 20/00* (2013.01); *H01L 31/0687* (2013.01); *H01L 31/0522* (2013.01); *Y02E 10/52* (2013.01); *Y02E 10/544* (2013.01); *H01L 31/0693* (2013.01)
USPC ............................. 136/256; 136/255; 136/252

(58) Field of Classification Search
USPC .......................................... 136/256, 255, 252
See application file for complete search history.

(56) References Cited

U.S. PATENT DOCUMENTS

| | | | | |
|---|---|---|---|---|
| 4,255,211 | A  * | 3/1981 | Fraas | 136/249 |
| 4,667,059 | A  * | 5/1987 | Olson | 136/249 |
| 4,686,323 | A  * | 8/1987 | Biter et al. | 136/249 |
| 4,881,979 | A  * | 11/1989 | Lewis | 136/249 |
| 4,922,218 | A  * | 5/1990 | Watanabe et al. | 136/261 |
| 5,019,177 | A  * | 5/1991 | Wanlass | 136/249 |
| 5,024,953 | A  * | 6/1991 | Uematsu et al. | 438/71 |
| 5,258,077 | A | 11/1993 | Shahryar | |
| 5,261,969 | A | 11/1993 | Stambery | |
| 5,322,572 | A | 6/1994 | Manlass | |
| 6,316,715 | B1 * | 11/2001 | King et al. | 136/255 |
| 6,372,980 | B1 * | 4/2002 | Freundlich | 136/255 |
| 6,420,647 | B1 | 7/2002 | Ji | |
| 6,590,258 | B2 | 7/2003 | Divakaruni | |
| 6,663,944 | B2 | 12/2003 | Park | |
| 6,815,736 | B2 * | 11/2004 | Mascarenhas | 257/201 |
| 7,141,834 | B2 | 11/2006 | Atwater | |
| 7,148,417 | B1 * | 12/2006 | Landis | 136/262 |
| 2002/0050288 | A1 | 5/2002 | Suzuki | |
| 2003/0070707 | A1 * | 4/2003 | King et al. | 136/255 |

(Continued)

FOREIGN PATENT DOCUMENTS

WO    WO2005/104236 A2    11/2005

*Primary Examiner* — Golam Mowla

(74) *Attorney, Agent, or Firm* — Louis J. Percello; Ryan, Mason & Lewis, LLP

(57) ABSTRACT

An energy conversion device comprises at least two thin film photovoltaic cells fabricated separately and joined by wafer bonding. The cells are arranged in a hierarchical stack of decreasing order of their energy bandgap from top to bottom. Each of the thin film cells has a thickness in the range from about 0.5 μm to about 10 μm. The photovoltaic cell stack is mounted upon a thick substrate composed of a material selected from silicon, glass, quartz, silica, alumina, ceramic, metal, graphite, and plastic. Each of the interfaces between the cells comprises a structure selected from a tunnel junction, a heterojunction, a transparent conducting oxide, and an alloying metal grid; and the top surface and/or the lower surface of the energy conversion device may contain light-trapping means.

17 Claims, 11 Drawing Sheets

(56) References Cited

U.S. PATENT DOCUMENTS

| | | | |
|---|---|---|---|
| 2004/0065363 A1* | 4/2004 | Fetzer et al. | ............. 136/262 |
| 2005/0242364 A1 | 11/2005 | Moustakas | |
| 2006/0021565 A1 | 2/2006 | Zahler | |
| 2006/0185582 A1 | 8/2006 | Atwater | |
| 2007/0137698 A1* | 6/2007 | Wanlass et al. | ............. 136/261 |

* cited by examiner

TANDEM NANOFILM INTERCONNECTED SEMICONDUCTOR WAFER SOLAR CELLS

CROSS-REFERENCE TO RELATED APPLICATIONS

This application contains subject matter which is related to the subject matter of the following commonly assigned applications, including U.S. patent application Ser. No. 12/242,962 filed on 1 Oct. 2008 of Hovel entitled "Optical Tandem Photovoltaic Cell Panels", now U.S. published application 2010/0078056-A1; and U.S. patent application Ser. No. 12/243,995 filed on 2 Oct. 2008 of Hovel entitled "Quantum Well Gap/Si Tandem Photovoltaic Cells", now U.S. Pat. No. 8,101,856. Each of the above listed patent applications is hereby incorporated herein by reference in its entirety.

BACKGROUND

Definitions

Electromagnetic Radiation to Electric Energy Conversion Device (EREECD): A device that reacts with electromagnetic (optical) radiation to produce electrical energy Optical Radiation to Electric Energy Conversion Device (OREECD): A device that reacts with optical electromagnetic radiation to produce electrical energy. Such a device could be a radiation absorbing device, e.g. a photodetector/counter, photovoltaic cell (solar cell) or a radiation-driven electrolysis cell.

Optoelectronic Energy Device (OED): A device that reacts with optical radiation to produce electrical energy with an electronic device.

Photovoltaic cell: An electrical device (e.g. a semiconductor) that converts light or other radiant energy, in the range from ultraviolet to infrared radiation, incident on its surface into electrical energy in the form of power/voltage/current which has two electrodes, usually a diode with a top electrode and a bottom electrode with opposite electrical polarities. The photovoltaic cell produces direct current which flows through the electrodes. As employed herein, the term photovoltaic cell is generic to cells which convert radiant energy into electrical energy including EREECDs, OREECDs, and OEDs as defined above.

Solar cell: An electrical photovoltaic device (e.g. a semiconductor) that converts light incident on its surface into electrical energy which has two electrodes, usually a diode with a top electrode and a bottom electrode with opposite electrical polarities. The solar cell produces direct current which flows through the electrodes. As employed herein, the term solar cell is generic to cells which convert radiant energy into electrical energy.

This invention relates to tandem photoelectric devices formed from separate photovoltaic cells and more particularly to interconnections therebetween.

Multijunction photovoltaic cells are devices containing two or more photovoltaic cells of different bandgaps connected in series and exposed to sunlight such that higher energy photons are absorbed in the upper-lying photovoltaic cells with their higher bandgaps while lower energy photons are transmitted to the lower bandgap photovoltaic cells in the stack. This combination makes more efficient use of the solar spectrum by converting more of it to electricity rather than heat. For example, single junction photovoltaic cells have a maximum efficiency of approximately 30% while multijunctions can exceed 50%, and 40% efficient triple junction photovoltaic cells have already been demonstrated. Such photovoltaic cells can be made in part by epitaxial growth of all the materials and layers.

For example, a triple junction photovoltaic cell, consists of a Ge N+/P junction, a P+/P/N+ GaAs photovoltaic cell grown upon the Ge, a P+/P/N+ GaInP junction grown upon the GaAs, with the P+/N+ boundaries acting as tunnel junctions, a AlInP passivating window layer upon the GaInP, a GaAlAs passivating window layer grown upon the GaAs, totaling twelve to seventeen layers of semiconductor material each of which must be lattice matched to all the others to prevent lattice mismatch defect formation, and each has to have an accurately determined thickness to ensure equal photocurrents in each photovoltaic cell (currents must be equal in each photovoltaic cell of an electrically series connection to obtain maximum power output and prevent anyone of the cells acting as a power-draining efficiency-lowering load upon the others). A major problem can arise due to the need to prevent diffusion of dopant from any of the layers into adjacent regions. Such cross diffusion raises the resistance of the tunnel junctions and lowers efficiency. This sets a limit on the temperature/time profile during fabrication. In semiconductor fabrication, the simultaneous requirements of tight control of many variables (temperature, time, thicknesses, lattice matching, dopant densities) generally lowers yield and raises costs.

Wafer bonding represents an improved process for creating multijunction photovoltaic cells. By creating photovoltaic cells of different materials and bandgaps separately and joining them by bonding, each photovoltaic cell can be optimized and yield can be raised. Such bonded tandem photovoltaic cells are described, e.g. Zahler et al U.S. patent publication 2006/0021565 that discusses creating a GaAs/GaInP dual junction tandem photovoltaic cell by monolithic epitaxy means and bonding this to a silicon photovoltaic cell/substrate. Exfoliation (separation of the desired device volume from the handle substrate) is generally induced by low ion mass ion implantation which causes a weak zone in the material which cracks off upon heating if the ion density is sufficient. Bonding by electrostatic means (applying a high electric field) is described in Stambery U.S. Pat. 5,261,969.

One means of increasing the efficiency of photovoltaic cells is to incorporate quantum well layers within the depletion region of the photovoltaic cell p/n junction. Such quantum wells may be alternating layers of materials having a thickness less than ten nanometers with lower bandgaps than the host junction in order to increase the sunlight wavelength range over which the photovoltaic cell operates. Such quantum well incorporation has been discussed in Moustakas WO2005/104236, Moustakas et al. U.S. patent publication 2005/0242364, and Suzuki U.S. patent publication 2002/0050288A1 which also describe texturing the surface of the upper photovoltaic cell to reduce light reflection.

Quantum well incorporation and tunnel junction formation in monolithic tandem photovoltaic cells are discussed in Freundlich U.S. Pat. No. 6,372,980. The above mentioned WO20051104236, Park et al U.S. Pat. 6,663,944, Ji et al. U.S. Pat. No. 6,420,647, and Shaharyar U.S. Pat. No. 5,258,077 describe the use of textured surfaces to result in light trapping in thin films of semiconductors, such that light which is not absorbed in the first pass through the material will make multiple passes which increases its absorption probability. Fabricating tandem photovoltaic cells with a metal interconnect between intermediate cells in place of a tunnel junction is described in Manlass U.S. Pat. No. 5,322,572.

SUMMARY OF THE INVENTION

The present invention relates to means for fabricating multijunction photovoltaic cells with higher yield and lower cost than conventional monolithic fabrication that uses epitaxial deposition of materials. The invention makes use of 1) semiconductor wafer bonding 2) both conventional and novel interconnection schemes, and 3) combinations of different material properties to optimize tandem photovoltaic cell structures. Photovoltaic cells are made in two or more materials with different energy bandgaps. By fabricating such photovoltaic cells separately, each photovoltaic cell can be optimized for highest performance. After fabrication, a first photovoltaic cell which is to be located on the bottom made from a first material with the lowest bandgap is mounted by suitable means on a low cost substrate such as glass, metal, or plastic. The first photovoltaic cell may be thin although it does not need to be thin. The second photovoltaic cell composed of a second higher energy bandgap material (hereinafter material #2) is wafer bonded onto the first photovoltaic cell with suitable mechanical and electrical interconnect means. Exfoliation is used to remove the main part of the substrate from the back surface of material #2 leaving a thin device structure such as an N+/P/P+ junction. A third junction composed of a third, highest energy bandgap material (i.e. with a higher energy bandgap than material #2) can be wafer bonded onto the back surface of photovoltaic cell #2 to form a triple junction photovoltaic cell. If desired, subsequent junctions with yet higher bandgaps can be further wafer bonded onto the structure to form multijunctions with higher numbers of junctions. Each additional junction requires suitable interconnect means with the criteria that each interconnect material is low in electrical resistance, but high in optical transparency for all photon energies less than the bandgaps of the higher lying photovoltaic cells. Interconnects can be made by the processing steps as follows: 1) bonding heavily doped semiconductor regions to create tunnel junctions; 2) first growing a heterojunction material on the front surface of the lower photovoltaic cell and/or back surface of the higher photovoltaic cell and wafer bonding the heterojunctions (the heterojunctions may also act as "window" layers (surface passivation layers) to prevent surface recombination; 3) depositing Transparent Conducting Oxides (TCO's) on one or both surfaces to be bonded; 4) depositing a thin metal grid on one surface of a photovoltaic cell and bonding the thin metal-gridded surface of one semiconductor to another semiconductor.

In accordance with this invention, a solar energy conversion multijunction device comprises thin film photovoltaic cells; with an upper photovoltaic cell of higher energy bandgap bonded on top of a lower photovoltaic cell of lower energy bandgap. Preferably, the upper photovoltaic cell has a thickness in the range from about 0.5 microns to about 10 microns; and/or the lower photovoltaic cell is mounted on a substrate composed of a material selected from the group consisting of silicon, glass, quartz, silica, alumina, ceramic, metal, graphite, and plastic. Preferably, there is an interface between the upper photovoltaic cell and the lower photovoltaic cell; wherein the interfaces between the photovoltaic cells comprises a structure selected from the group consisting of a tunnel junction, a heterojunction, a transparent conducting oxide, an alloying metal, and an alloyed metal grid. Additionally, the upper photovoltaic cell may contain a quantum well region; and/or at least one of the top surface or bottom surface of the energy conversion device contains light-trapping means.

In accordance with another aspect of this invention, a solar energy conversion device comprises three photovoltaic cells comprising individual, thin film devices; and two of the photovoltaic cells are bonded to a third one of the photovoltaic cells. Preferably, the photovoltaic cells have thicknesses in the range of about 0.5 microns to about 10 microns; and/or an upper one of the photovoltaic cells has an energy bandgap of at least about 1.7 electron volts, a middle one of the photovoltaic cells has a bandgap between about 1.2 electron volts and about 1.7 electron volts, and a lower one of the photovoltaic cells has an energy bandgap below about 1.2 electronvolts. It is preferred that all three of the photovoltaic cells have thicknesses in the range from about 0.5 microns to 10 microns; and/or a lower one of the photovoltaic cells is mounted on a substrate composed of a material selected from the group consisting of silicon, glass, quartz, silica, alumina, ceramic, metal, graphite, and plastic.

Preferably, each interface between the photovoltaic cells comprises a structure selected from the group consisting of a tunnel junction, a heterojunction, a transparent conducting oxide, and an alloying metal; and/or one or more of the thin film photovoltaic cells may contain quantum well or quantum dot regions. Quantum dots are nanoparticles less than 10 nanometers in size made from a material with a smaller bandgap than the host material, for example, Ge quantum dots in a Si host. Preferably light-trapping means is incorporated atop the energy conversion device.

In accordance with yet another aspect of this invention, an energy conversion device comprises photovoltaic cells formed on wafers fabricated separately and bonded together with interfaces therebetween; with the two or more of the photovoltaic cells being arranged in a hierarchical stack of decreasing order of energy bandgaps from top to bottom thereof. At least one of the photovoltaic cells comprises a thin film photovoltaic cell having a thickness in the range from about 0.5 microns to about 10 microns. Each of the interfaces between the photovoltaic cells comprises a structure selected from the group consisting of a tunnel junction, a heterojunction, a transparent conducting oxide, an alloying metal, and an alloyed metal grid; and the photovoltaic cells are mounted onto a substrate composed of a material selected from the group consisting of silicon, quartz, glass, silica, alumina, ceramic, metal, graphite, and plastic. Preferably, the energy conversion device includes an upper surface and/or a lower surface including light trapping means; and/or at least one of the photovoltaic cells may contain a quantum well or quantum dot region.

In accordance with yet another aspect of this invention at least two film photovoltaic cells are fabricated separately and joined by wafer bonding at interfaces between the photovoltaic cells. The photovoltaic cells are arranged in a hierarchical stack of decreasing energy bandgap thereof from top to bottom. Each of the thin film photovoltaic cells has a thickness in the range from about 0.5 microns to about 10 microns. The hierarchical stack is mounted upon a supporting substrate composed of a material selected from the group consisting of silicon, glass, quartz, silica, alumina, ceramic, metal, graphite, and plastic. Each of the interfaces between the photovoltaic cells comprises a structure selected from the group consisting of a tunnel junction, a heterojunction, a transparent conducting oxide, an alloying metal, and an alloyed metal grid; and an upper surface and/or a lower surface of the energy conversion device containing light-trapping means. Additionally, the photovoltaic cells may contain a quantum well or quantum dot region; and the bottom surface of the energy conversion device contains light-trapping means.

DETAILED DESCRIPTION OF THE PREFERRED EMBODIMENTS

Figure 1:
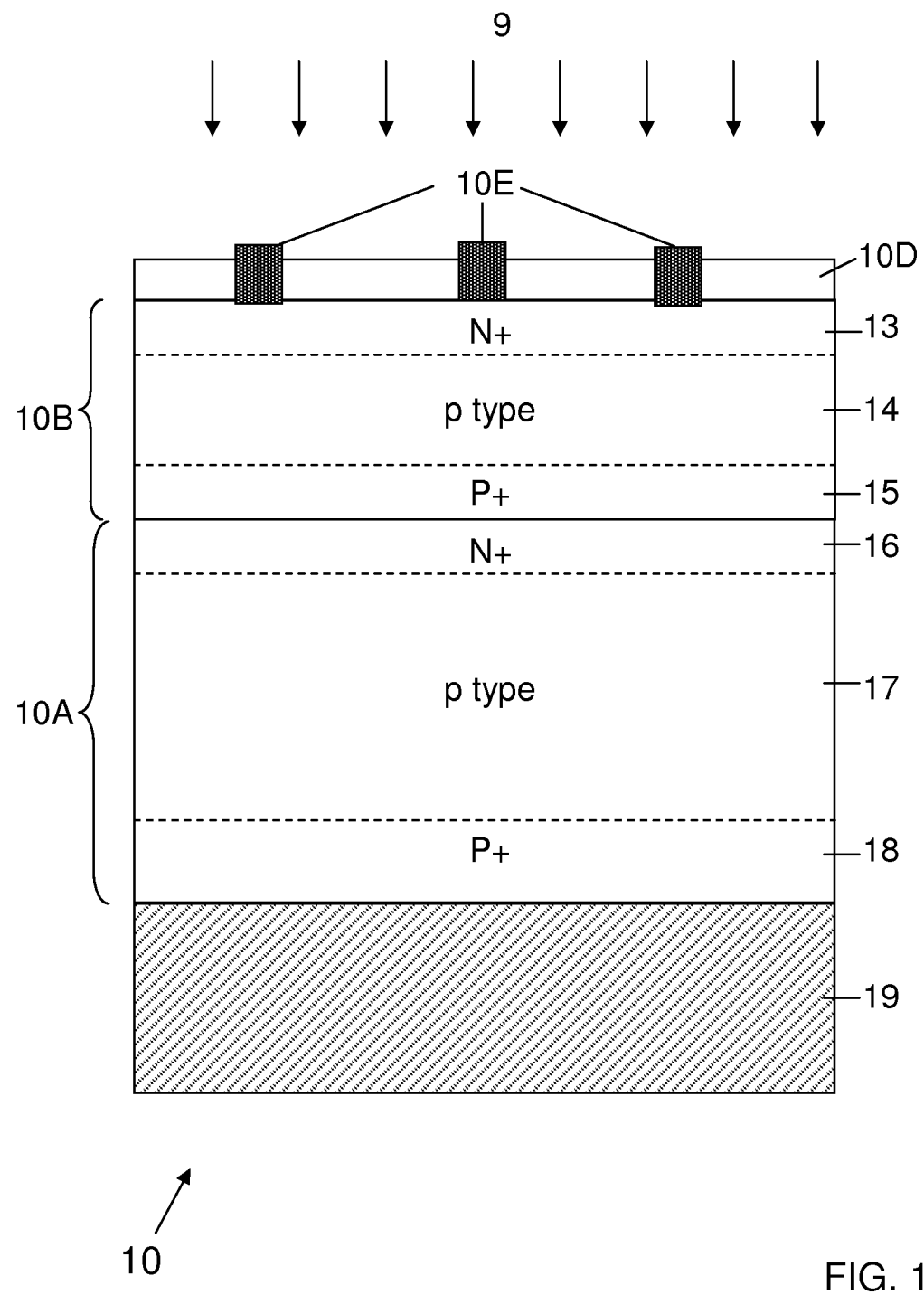
FIG. 1 shows a multijunction photovoltaic energy conversion device comprising two junctions made by separate photovoltaic cell fabrication and subsequent wafer bonding.

In FIG. 1, a tandem, multijunction, photovoltaic energy conversion device 10 consisting of two separate, stacked, photovoltaic cells 10A and 10B composed of semiconductor materials and illuminated by radiant energy, e.g. sunlight 9. The lower photovoltaic cell 10A comprises a semiconductor wafer composed of material #1 which contains an N+ doped region 16, a p-type doped region 17, and a P+ doped region 18 that is mounted on a substrate 19 using suitable means, such as alloying, adhesive, or bonding. The substrate 19 is composed of a material such as silicon, glass, quartz, silica, alumina, ceramic, metal, graphite, and plastic. The upper photovoltaic cell 10B comprises a semiconductor wafer which is made using a material #2 with a higher bandgap than the material #1 used to make photovoltaic cell 10A, consists of an N+ doped region 13, a P-type doped region 14, and a P+ doped region 15; and the upper photovoltaic cell 10B is mounted to the lower photovoltaic cell 10A using wafer bonding. The process of wafer bonding may be accomplished by several means, for example 1) ion implantation of hydrogen or helium ions is performed first and then followed by steps of exfoliation, 2) growth upon a porous region and selective etching of the porous region, and other methods known in the art. Bonding takes place when two very clean, atomically flat surfaces are brought into contact so that atoms on the surfaces of the two materials interact to cause the materials to adhere to each other. Exfoliation is the separation of a portion of one of the materials which remains affixed to the other. The separation is accomplished by heat treatment or mechanical means such as a water jet, or by selective etching as mentioned above.

The photovoltaic cells 10A and 10B are made separately and the processes and procedures for making such photovoltaic cells can be optimized separately. The P+ doped region 15 and N+ doped region 16 on the borders between the photovoltaic cell 10B and photovoltaic cell 10A are so heavily doped that the boundary between them forms a tunnel junction providing a low resistance interconnect.

Figure 2:
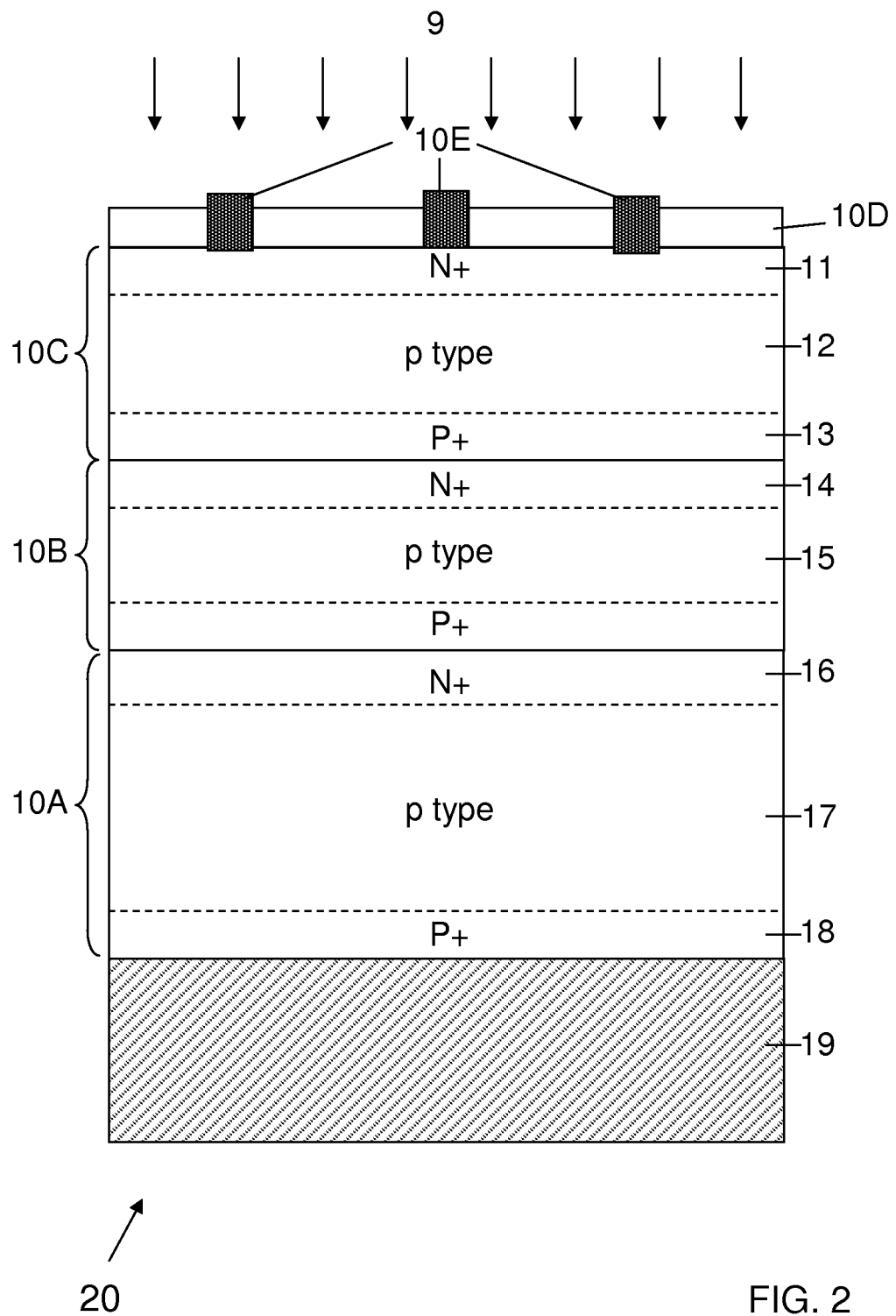
FIG. 2 shows a multijunction photovoltaic energy conversion device consisting of a stack of three separate photovoltaic cells made by separate photovoltaic cell fabrication and joined by subsequent wafer bonding.

FIG. 2 shows a tandem, triple junction photovoltaic energy conversion device 20 illuminated by radiant energy, e.g. sunlight 9, and consisting of three separate photovoltaic cells 10A, 10B, and 10C. The multijunction solar device 20 can be fabricated, for example, by adding a third separate photovoltaic cell 10C to the double junction tandem, photovoltaic cell device 10 of FIG. 1. The third photovoltaic cell 10C, which is composed of a semiconductor wafer using a material #3 with a higher bandgap than the material #2 used to make photovoltaic cell 10B, consists of an N+ doped region 11, a P-type doped region 12, and a P+ doped region 13. Alternately, different materials may be used for photovoltaic cells 10A and 10B. Photovoltaic cells 10A, 10B, and 10C may be fabricated and optimized separately and attached to substrate 19 by alloying, adhesives, or wafer bonding. Photovoltaic cell 10B is mounted on photovoltaic cell 10A by wafer bonding, and photovoltaic cell 10C is mounted on photovoltaic cell 10B by wafer bonding. Metal contacting grids 10E and antireflective coatings 10D are added to complete the photovoltaic cell, are well known in the photovoltaic cell art.

The lower photovoltaic cell 10A in FIGS. 1 and 2 may comprise a thick "bulk" semiconductor wafer such as silicon and substrate 19 may be glass, a metal such as aluminum or stainless steel, a ceramic material such as alumina or silica or graphite, or a plastic material, or it may be a silicon wafer such as low-cost metallurgical grade silicon. If the lower photovoltaic cell 10A is a bulk wafer, the substrate 19 is optional and may be used for structural strength or is not necessary if the photovoltaic cell 10A will be mounted onto a photovoltaic cell module directly using solder as is standard in the photovoltaic cell art.

Figure 3:
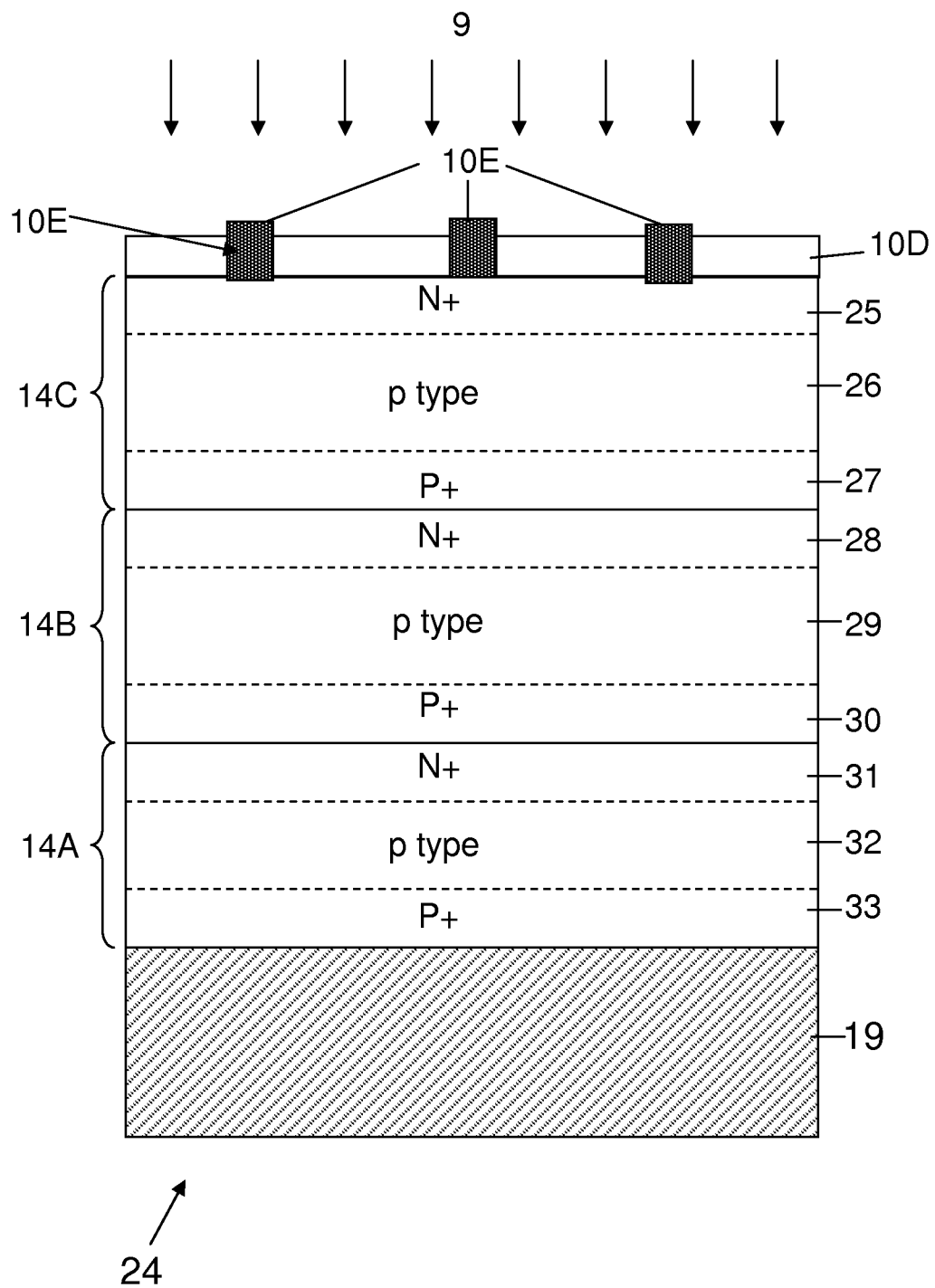
FIG. 3 shows a multijunction photovoltaic energy conversion device consisting of a stack of three thin film photovoltaic cells mounted on a low cost substrate.

FIG. 3 shows a second triple junction photovoltaic energy conversion device 24 illuminated by radiant energy, e.g. sunlight 9, in which a set of three photovoltaic cells 14A, 14B, and 14C from bottom to top are thin film photovoltaic cells with the lower photovoltaic cell 14A mounted by wafer bonding onto a substrate 19. Each of the photovoltaic cells 14A, 14B, and 14C is mounted onto a surface therebelow by wafer bonding. The lower photovoltaic cell 14A has N+ doped region 31 formed above a p-type doped region 32, which is formed above a P+ doped region 33 which in turn is mounted on the substrate 19 which is described in more detail below. The middle photovoltaic cell 14B has an N+ doped region 28 formed above a p-type doped region 29, which is formed above a P+ doped region 30 which in turn is formed above the N+ doped region 31 of the lower photovoltaic cell 14A. The uppermost photovoltaic cell 14C has an N+ doped region 25 formed above a p-type doped region 26, which is formed above a P+ doped region 27 which in turn is formed above the N+ doped region 28 of the middle photovoltaic cell 14B. Each of the interconnect interfaces between the P+ region 27 at the bottom of the photovoltaic cell 14C and the top N+ region 28 of the middle photovoltaic cell 14B, and the P+ region 30 at the bottom of the photovoltaic cell 14B and the top N+ region 31 of the bottom photovoltaic cell 14A forms a tunnel junction interconnect interface. For example the thicknesses of photovoltaic cells 14A, 14B, and 14C may be from about 0.5 microns to about 10 microns in thickness. The substrate 19 may be a metal, graphite, conductor-coated ceramic, or conductor-coated plastic. If the substrate 19, which is shown as a metal for illustration, is composed of a conductor-coated ceramic, or conductor coated plastic, the conductor coating is present on substrate 19 to make electrical contact to the bottom surface of the P+ region 33 of the bottom photovoltaic cell 14A, and may be a metal, Transparent Conducting Oxide (TCO) material, or a heavily doped semiconductor material.

Figure 4A:
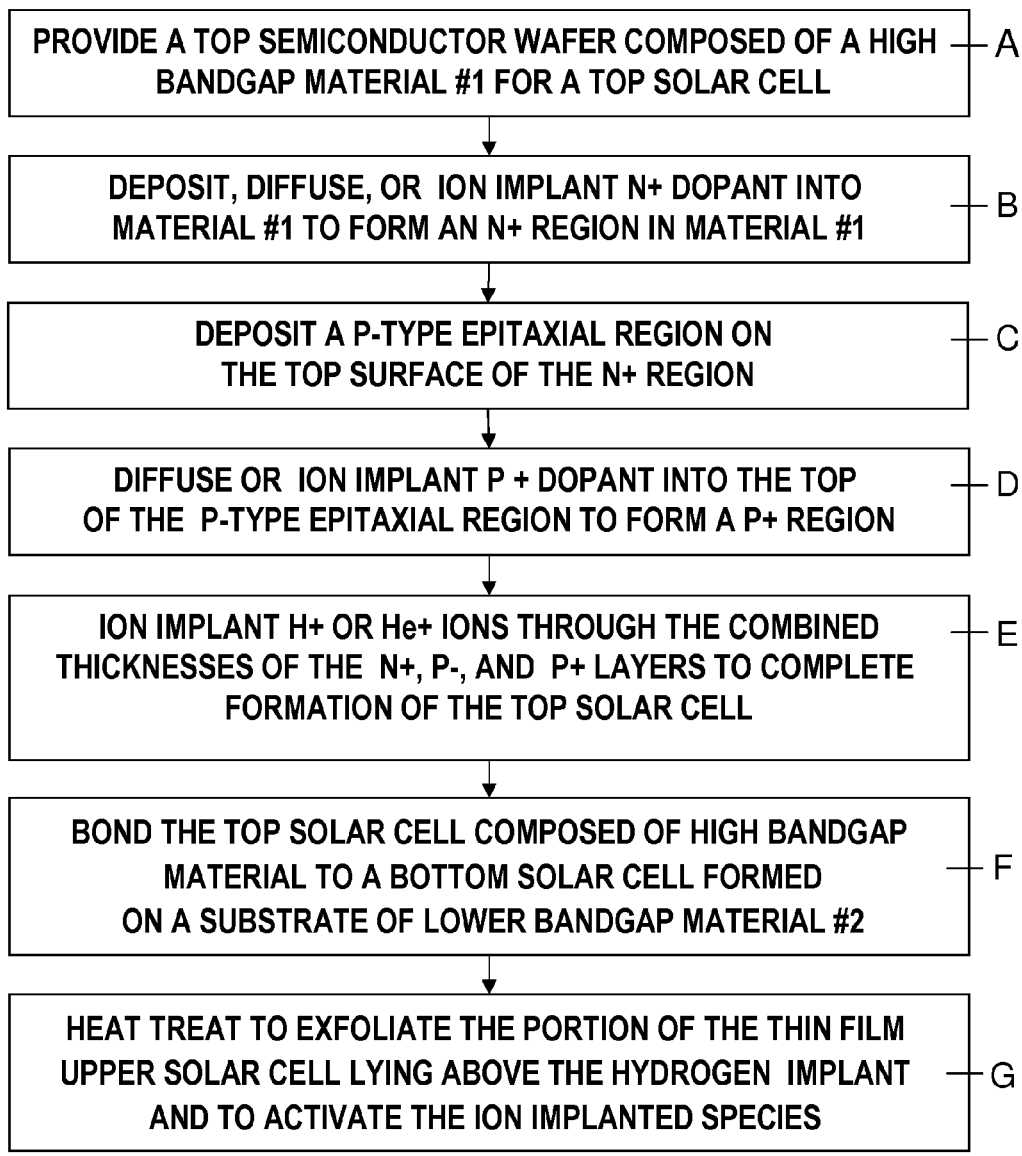
FIGS. 4A and 4B show alternative process sequences by which wafer bonding of individual photovoltaic cells and exfoliation is accomplished.
Figure 4B:
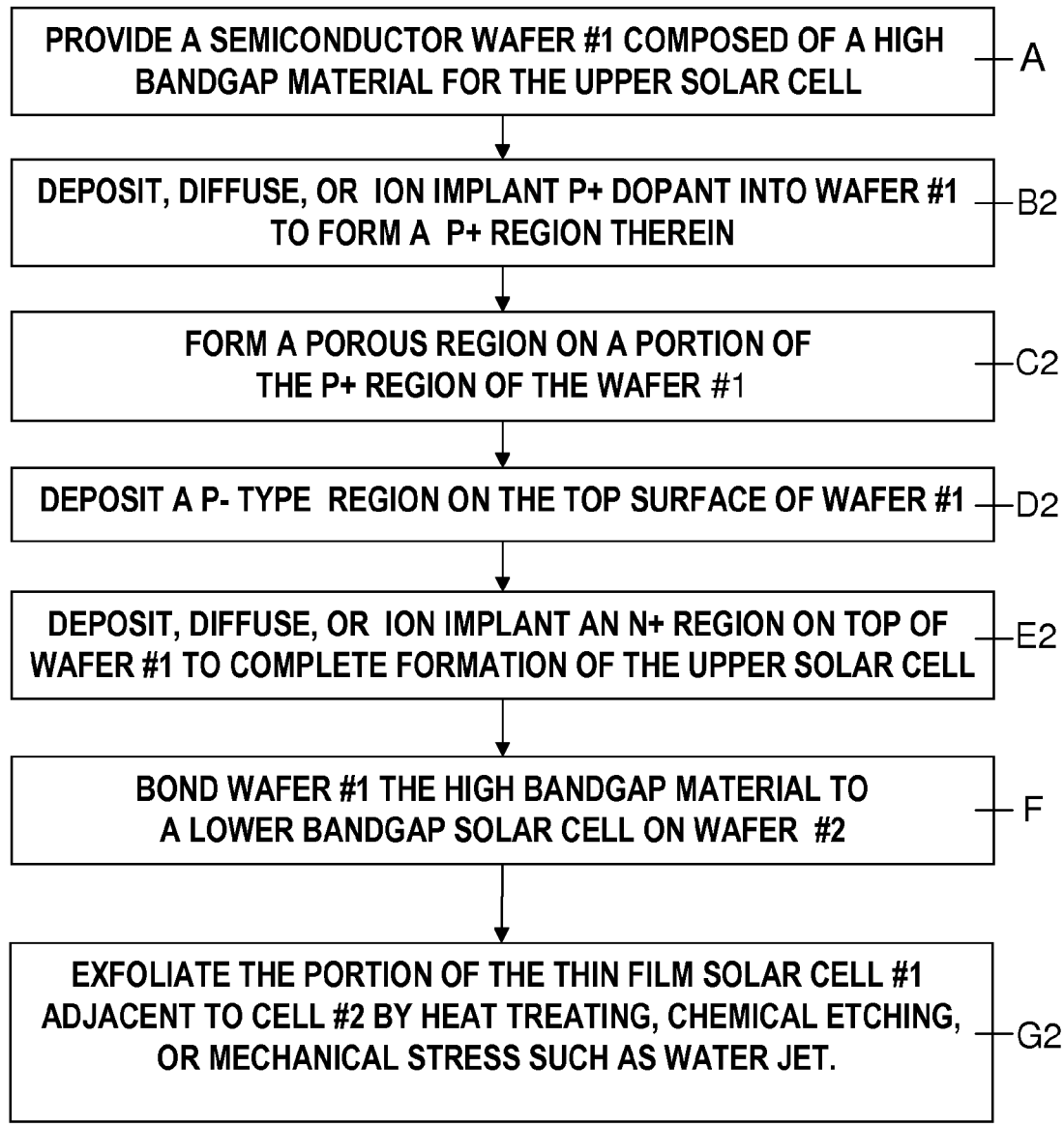

FIGS. 4A and 4B show alternative process sequences by which wafer bonding of individual photovoltaic cells and exfoliation is accomplished. FIG. 4A shows a process flow in which wafer bonding of the individual photovoltaic cells may be performed by a first method, including implantation and exfoliation. The process flow is shown for bonding a higher bandgap material #1 onto a photovoltaic cell made from material #2. The higher bandgap material #1, for example, can be GaAs, GaP, GaInP, InAlP, GaAsP, CdTe, CdZnTe, or other semiconductor with a high bandgap of 1.4 eV or higher. For example, the lower bandgap material #2, can be silicon, germanium, SiGe alloys, CIGS (Copper Indium Gallium Selenide), or other semiconductor with a lower bandgap less than 1.4 eV.

In step A of FIG. 4A, a wafer composed of a high bandgap material #1 is chosen to fabricate an upper photovoltaic cell.

In step B, a narrow thickness of an N+ doped region is first formed in material #1 by diffusion, by deposition (such as vapor growth or evaporation), or by ion implantation.

In step C, a region of lightly-doped p-type material is deposited on the top surface of the N+ doped wafer composed of material #1 by a suitable means such as vapor growth, liquid phase epitaxy, or molecular beam epitaxy.

In step D, a region of P+ doping is then created in the layer deposited in step C. The P+ doping is performed by diffusion or ion implantation.

In step E, a hydrogen and/or helium implantation is made through the P+, P−, and N+ regions with energy at a high enough level to create a heavy hydrogen or helium concentration deeper below the surface than the N+ doped region.

In step F, material #1 is then bonded to the surface of a previously-fabricated photovoltaic cell #2 by methods well known in the bonding art, e.g. bringing the cleaned and atomically flat surfaces of the P+ region of material #1 into contact with the clean, flat N+ surface of material #2. The photovoltaic cell #2 may have been fabricated by bonding or by other techniques such as vapor growth. In FIG. 1, the two junction tandem photovoltaic cell 10 described above is shown wherein cell 10A is formed of material #2 and cell 10B is formed of material #1. Materials #1 and #2 can be taken from the groups of materials described hereinabove.

Finally, in step G, a furnace anneal or Rapid Thermal Anneal (RTA) is carried out for simultaneously exfoliating the portion of photovoltaic cell #1 lying above the hydrogen implant (the layers exfoliate by cracking off) and activating the ion implanted species. RTA is preferred from both a cost point of view and to prevent dopant movement which could degrade the tunnel junctions formed at the heavily doped interface between the two photovoltaic cells. The result is a photovoltaic tandem cell such as the photovoltaic energy conversion device 10 in FIG. 1 comprised of a material #1 forming cell 10B and a material #2 forming cell 10A.

The bonding and exfoliation are best carried out with direct bandgap materials with very high absorption coefficients for light of photon energies greater than the bandgap. This allows the total thickness of the material to be exfoliated to be reduced. For example, the total thickness of the photovoltaic cell made from material #1 can be as low as from about 0.5 microns to about 10 microns as hereinabove mentioned and reduces the required hydrogen or helium implant energy. For example, material #1 could be GaInP, GaAlAs, CuGaSe, CdSeS, or GaAsP with a thickness of about 2 microns, while hydrogen or helium implantation can be carried out at an implanter voltage (potential) of about 350 kilovolts, commonly available in implant machines. If the photovoltaic cell of material 1 is from about 1 micron to about 1.5 microns thick, the implanter potential needed would be about 250 kilovolts. Thicker photovoltaic cell exfoliation would require greater potential. A photovoltaic cell with a thickness of about ten microns can be bonded and exfoliated with an implanter potential of about one million volts.

While FIG. 4A describes a first method in accordance with this invention for wafer bonding using hydrogen or helium implantation and exfoliation; FIG. 4B shows a process flow for wafer bonding of the individual photovoltaic cells by a second method which can be carried out by the use of porous silicon.

Step A is identical to step A in FIG. 4A. In step B2, a heavily doped P+ region is created on the top surface of the wafer that allows the porous region in step C2 to be formed, most commonly by anodization in hydrofluoric acid-water solution. A thicker, low doped P− region, that is deposited on the porous surface in step D2 is followed by the N+ junction formation in step E2. After bonding the photovoltaic cell #1 to previously fabricated photovoltaic cell #2 in step F, exfoliation can be carried out in step G2 by one of several means such as thermal cracking, chemical etching of the porous region, or mechanical means such as high power water jet or precision thin blades. Photovoltaic cell #2 may have been made by means of liquid phase epitaxy, evaporation, or by other techniques such as vapor growth. In the case of FIG. 1, the finished tandem photovoltaic cell 10 can be formed with the photovoltaic cell 10B being made from material #1 and represents a photovoltaic cell 10A made from material #2.

In one example of the process of FIG. 4B, a wafer of material #1, which may be GaInP, GaAlAs, CuGaSe, CdSeS, or GaAsP, or Silicon contains a P+ surface obtained by deposition, diffusion, or ion implantation and is from about 0.5 microns to about 2 microns thick, is placed in a chemical bath of hydrofluoric acid in water. Electrical contact is made to the P+ surface by an electrode and to an inert metal electrode, and a voltage is placed between the electrodes until a desired current is reached. As a consequence, the P+ layer forms a porous region with a pore size dependent on the current. Following porous region formation, a low doped P− layer is grown by suitable means such as vapor growth or evaporation upon the surface, and an N+ region is created upon the surface of the P− layer by additional deposition, diffusion, or ion implantation. Bonding of this photovoltaic cell of material #1 is carried out by the same means described hereinabove. Heat treatment can then be performed for simultaneously exfoliating the layer and activating the implant. Alternately, the porous region can be etched chemically or separated mechanically by, for example, high pressure water jet or precision thin blades which are inserted at the edge of the porous material with sufficiently-applied stress.

One advantage of the porous approach of FIG. 4B over the implantation/exfoliation method of FIG. 4A is that the allowed thicknesses of the layers are not limited by the available implanter potential. The exfoliation only depends on the depth of the porous region below the final surface of the photovoltaic cell, so that photovoltaic cells with thicknesses as much as about 10 microns in accordance with the invention can be easily implemented.

It is clear that variations in this bonding process flow can be made without changing the intent of the invention. It is also clear that the same process can be used to fabricate bonded multijunctions of three or more individual photovoltaic cells.

Figure 4C:
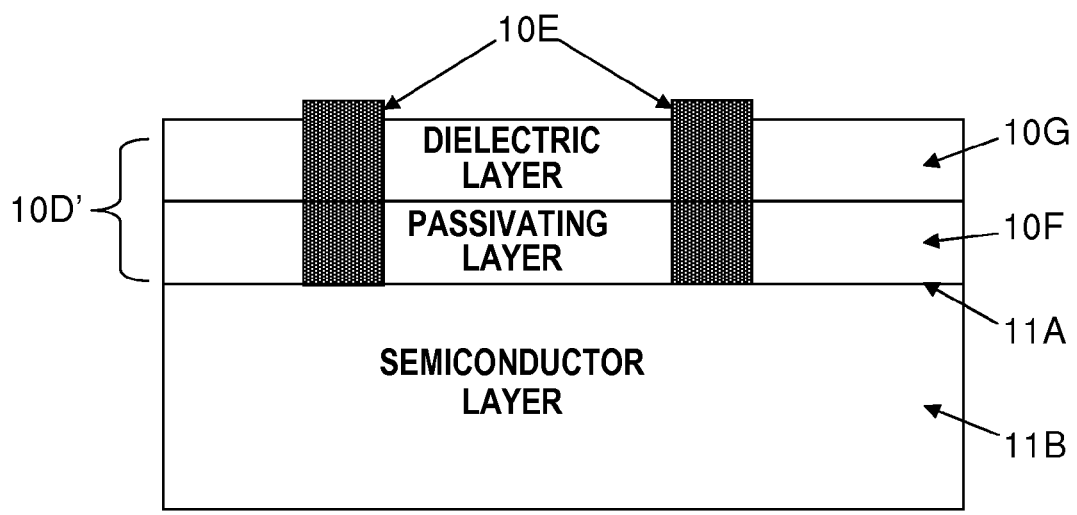
FIG. 4C shows a semiconductor layer coated by a passivating layer and a dielectric layer, the combination acting as an antireflective coating.

Photovoltaic cells have higher efficiency if the surface recombination is minimized by surface passivation means. FIG. 4C shows antireflective bilayer coating 10D' formed on the top surface 11A of a semiconductor layer 11B. The antireflective bilayer coating 10D' comprises a passivating layer 10P and an additional dielectric layer 10G. A plurality of metallic electrical contacts 10E pass through the antireflective bilayer coating 10D' and the passivating layer 10P into electrical and mechanical contact with the top surface 11A of the semiconductor layer 11B. This most often entails deposition of a semiconductor heterojunction layer with a higher bandgap onto a photovoltaic cell surface, where the heterojunction layer has a close lattice match to the photovoltaic cell to prevent interconnect interface defects. In FIGS. 1 to 3, the antireflective coating 10D may be modified to contain a heterojunction passivation layer as well as one or more dielectric layers to reduce light reflection from the surface, as will be well understood by those skilled in the art.

Figure 5:
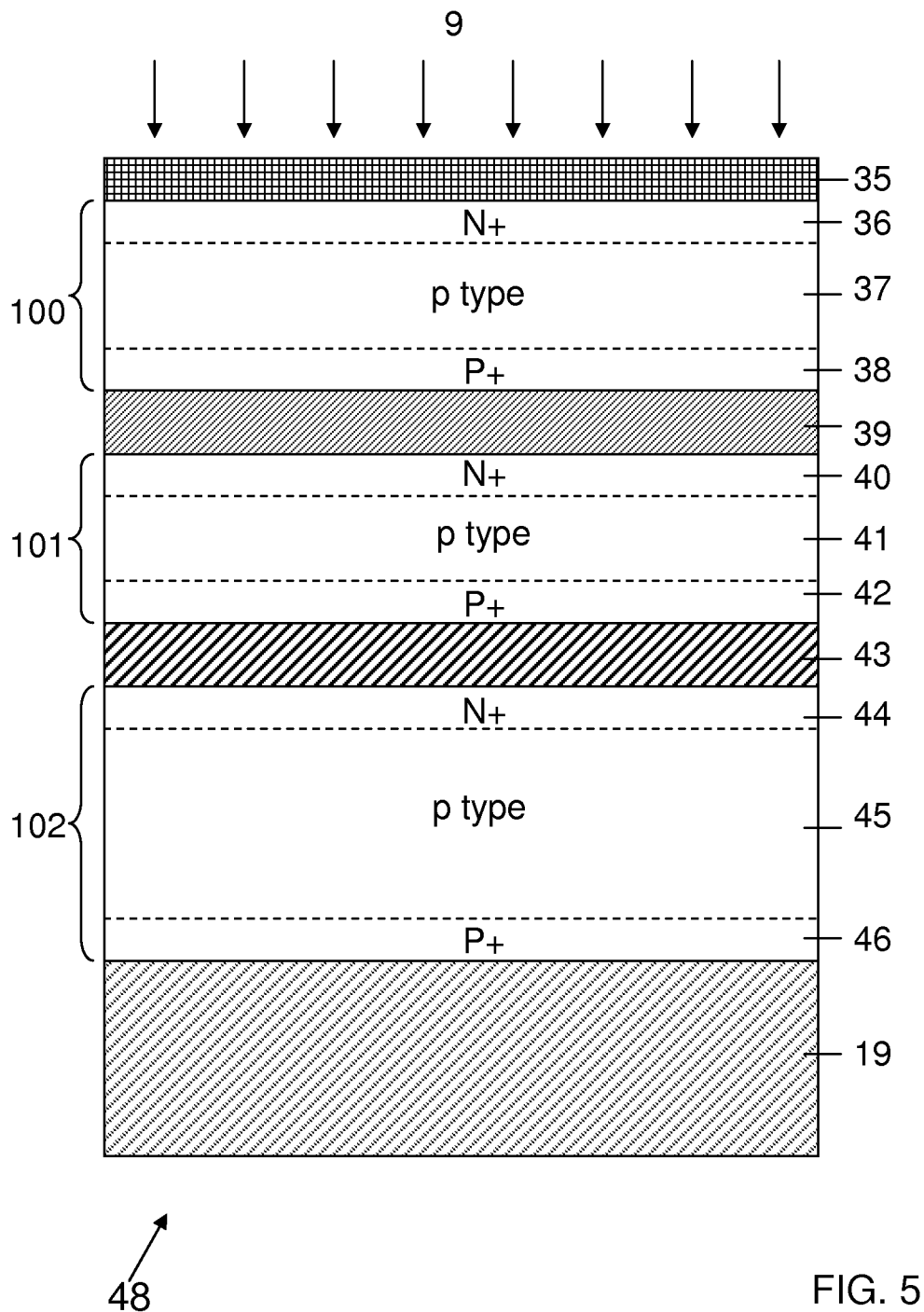
FIG. 5 shows a tandem photovoltaic cell with heterojunction layer interconnects.

FIG. 5 shows a third triple junction photovoltaic (PV) energy conversion device 48 illuminated by radiant energy, e.g. sunlight 9, including a stack of a bottom PV cell 102 mounted on a substrate 19, a middle PV cell 101 and a top PV cell 100. In this case the interconnect interfaces comprise a set of heterojunction layers. A top heterojunction layer 35 is formed directly on the top surface of N+ doped region 36 of the top PV cell 100. A first intermediate heterojunction layer 39 is formed between the top PV cell 100 and the middle PV cell 101 in direct contact with the bottom P+ region 28 of the top PV cell 100 and in direct contact with the top surface of N+ doped region 40 of the middle photovoltaic cell 101. A second intermediate heterojunction layer 43 is formed between the middle PV cell 101 and the bottom PV cell 102. The bottom PV cell 102 includes an upper N+ doped region 44 formed above a middle p-type doped region 45, which is formed above a lower P+ doped region 46 which is mounted on the substrate 19 which is composed of a material such as silicon, quartz, glass, metal, graphite, or plastic. The middle PV cell 101 includes an upper N+ doped region 40 formed above a middle p-type doped region 41, which is formed above a lower P+ doped region 42 that overlies the second (lower) intermediate heterojunction layer 43 which in turn is formed on top of the upper N+ doped region 44 of the bottom PV cell 102. The top PV cell 100 includes an upper N+ doped region 36 formed above a middle p-type doped region 37, which is formed above a lower P+ doped region 38 that overlies the first (middle) intermediate, heterojunction layer 39 which in turn is formed on top of the upper N+ doped region 40 of the middle PV cell 101. The upper heterojunction layer 35 is grown upon the top surface of the N+ doped region 36 of the top PV cell 100. The middle heterojunction layer 39 is grown upon the top surface of the N+ doped region 40 of the middle PV cell 101. Finally, the lower heterojunction layer 43 is present on the top surface of the upper N+ doped region 44 of the bottom PV cell 102.

While FIG. 5 shows a triple junction photovoltaic energy conversion device 48 formed with three photovoltaic cells, the same principle applies to two junction devices and multijunctions of more than three photovoltaic cells. Heterojunction layers for surface passivation may be deposited, for example, on as many photovoltaic cell surfaces as desired. Each photovoltaic cell may have such a heterojunction layer or a subset of the junctions in the tandem device may have them. If the heterojunction layers are heavily doped, they may also form part of the tunnel junction interconnect. For Ge and GaInAs photovoltaic cells suitable heterojunction materials include GaAs, GaAlAs, or ZnSe. For silicon photovoltaic cells suitable heterojunction materials include GaAsP, GaP or ZnS. For GaAs photovoltaic cells suitable heterojunction materials includes GaInP and GaAlAs. For GaInP suitable heterojunction materials photovoltaic cells includes AlInP.

Figure 6:
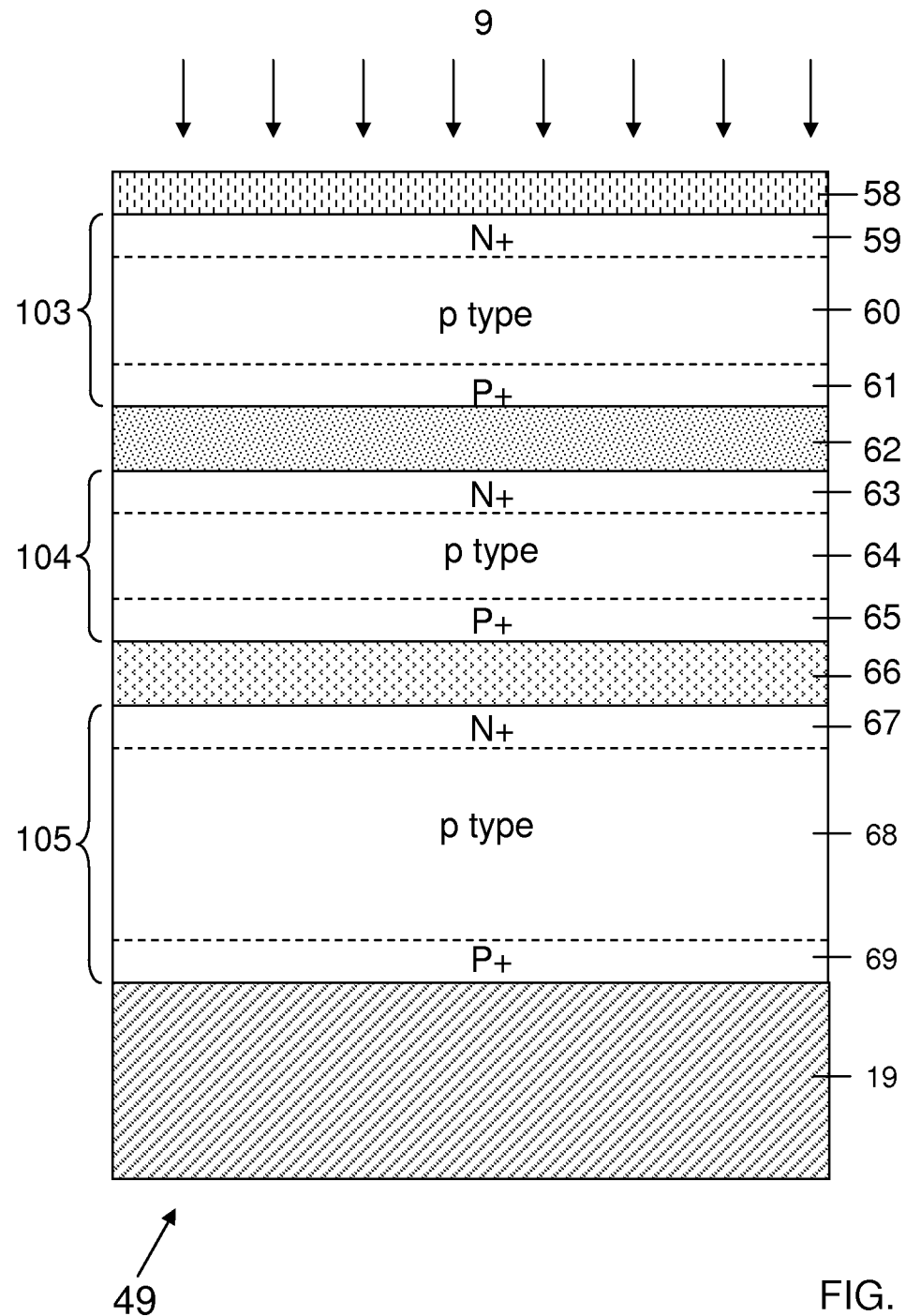
FIG. 6 shows a photovoltaic energy conversion device formed with tandem photovoltaic cells with transparent conducting oxide layer interconnects.

FIG. 6 shows a triple junction photovoltaic cell device 49 illuminated by radiant energy, e.g. sunlight 9, with an alternative to heterojunction layers at the bonding interconnect interfaces between individual photovoltaic cells including the top photovoltaic cell 103, the middle photovoltaic cell 104 and the bottom photovoltaic cell 105, which is formed on a substrate 19. A set of Transparent Conducting Oxides (TCO's) layers 58, 62, and 66 are formed above and between the individual photovoltaic cells 103, 104, and 105. Such TCO oxide layers 58, 62, and 66 have much higher conductivities than semiconductors and form good electrical contacts to heavily doped semiconductors. The top TCO layer 58 is formed on the top surface of the N+ doped region 59 of the top photovoltaic cell 103. The top photovoltaic cell 103 also contains p-type doped region 60 formed below the N+ doped region 59 and a P+ doped region 61 below the p-type doped region 60. The P+ doped region 61 is formed on top of the middle TCO layer 62 which is formed on the top surface of the N+ doped region 63 of the middle photovoltaic cell 104. The middle photovoltaic cell 104 also contains p-type doped region 64 formed below the N+ doped region 63 and a P+ doped region 65 formed below the p-type doped region 64. The bottom TCO layer 66 is formed below the P+ doped region 65 and on the top surface of an N+ doped region 67 of the lower photovoltaic cell 105, which also contains p-type doped region 68 formed below the N+ doped region 67 and an N+ doped region 69 formed below the N+ doped region 67 and on the top surface of the substrate 19. The three photovoltaic cells 103, 104, and 105 may be thin film photovoltaic cells as in FIG. 3 or a combination of thick and thin photovoltaic cells. Bonding may be carried out with the TCO layers in place. Examples of TCO's include but are not limited to Indium Tin Oxide (ITO), tin oxide (SnOx), Zinc Oxide (ZnOx), Cadmium tin Oxide (CdSnOx), and oxides doped with Al, Sb, and F.

Tandem photovoltaic cell structures may be made with a combination of heterojunction and TCO layers. What remains the same in either case is the use of wafer bonding to accomplish the tandem photovoltaic cell fabrication.

Figure 7:
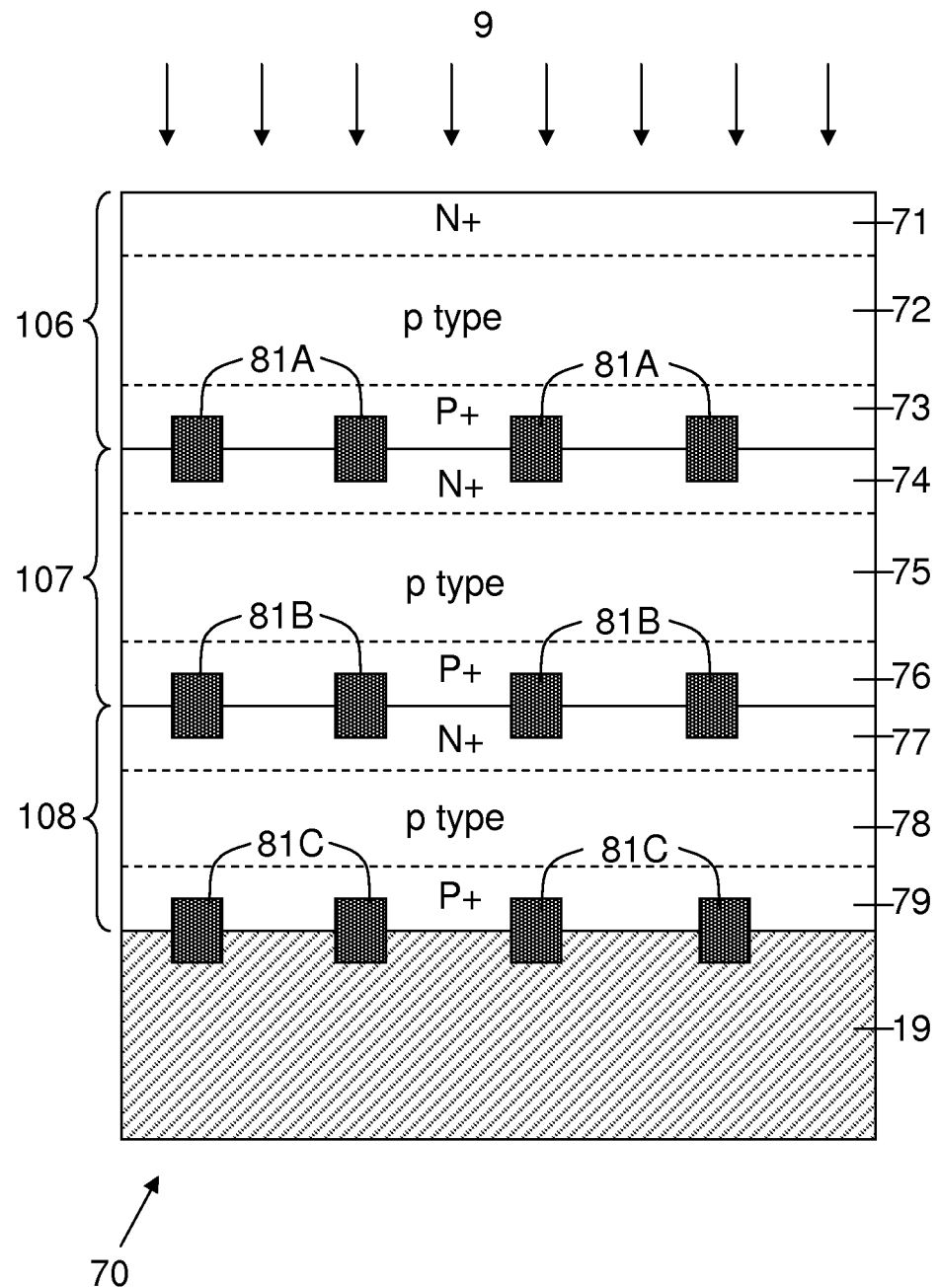
FIG. 7 shows a photovoltaic energy conversion device formed with tandem photovoltaic cells with a metallic grid interconnect alloyed to semiconductor materials.

FIG. 7 shows a photovoltaic energy conversion device formed 70 illuminated by radiant energy, e.g. sunlight 9, formed of tandem photovoltaic cells 106, 107, and 108 stacked from top to bottom with a set of metallic grid interconnect interfaces 81A, 81B and 81C respectively alloyed to semiconductor materials forming a triple junction of photovoltaic cells. The device 70 illustrates yet another method of joining multiple photovoltaic cells into a tandem structure composed of the top photovoltaic cell 106, the middle photovoltaic cell 107 and the bottom photovoltaic cell 108. The individual, middle photovoltaic cell 107 is joined to the bottom P+ layer 73 of the top photovoltaic cell 106 by a metal grid 81A. The metal grid 81A may be applied to either the bottom surface of the bottom P+ layer 73 of the top photovoltaic cell 106 or to the top surface N+ layer 74 of the middle photovoltaic cell 107. When heat treatment is performed as part of the bonding process, grid 81A alloys to both layer 73 and layer 74, forming an ohmic, low resistance contact to both layer 73 and layer 74. Likewise, a grid 81B may be placed either on the bottom surface of the bottom P+ layer 76 of the middle photovoltaic cell 107 or the top surface of the top N+ layer 77 of the photovoltaic cell 108. Upon heat treatment, the metal grid 81B alloys with both layer 76 and layer 77, causing a low resistance contact connecting photovoltaic cell 107 and 108. In similar fashion, a grid 81C can be placed on the lower surface of layer 79 to bond photovoltaic cell 108 to substrate 19. This allows the substrate 19 to be made of a metal which does not alloy with the semiconductor comprising photovoltaic cell 108, by using a metal grid such as 81C which alloys with photovoltaic cell 108. The use of a single metal grid such as 81A or 81B or 81C which alloys with two surfaces is a much simpler process than prior art methods of producing duplicate grids on both surfaces (for example, the surface of 73 and the surface of 74) and having to align the grids to mount the photovoltaic cells.

It will be apparent to one skilled in the art that a combination of tunnel junctions, heterojunctions, TCO's and/or alloying grids can be used in bonded tandem photovoltaic cells as described in FIG. 3 and FIGS. 5 to 7.

Figure 8A:
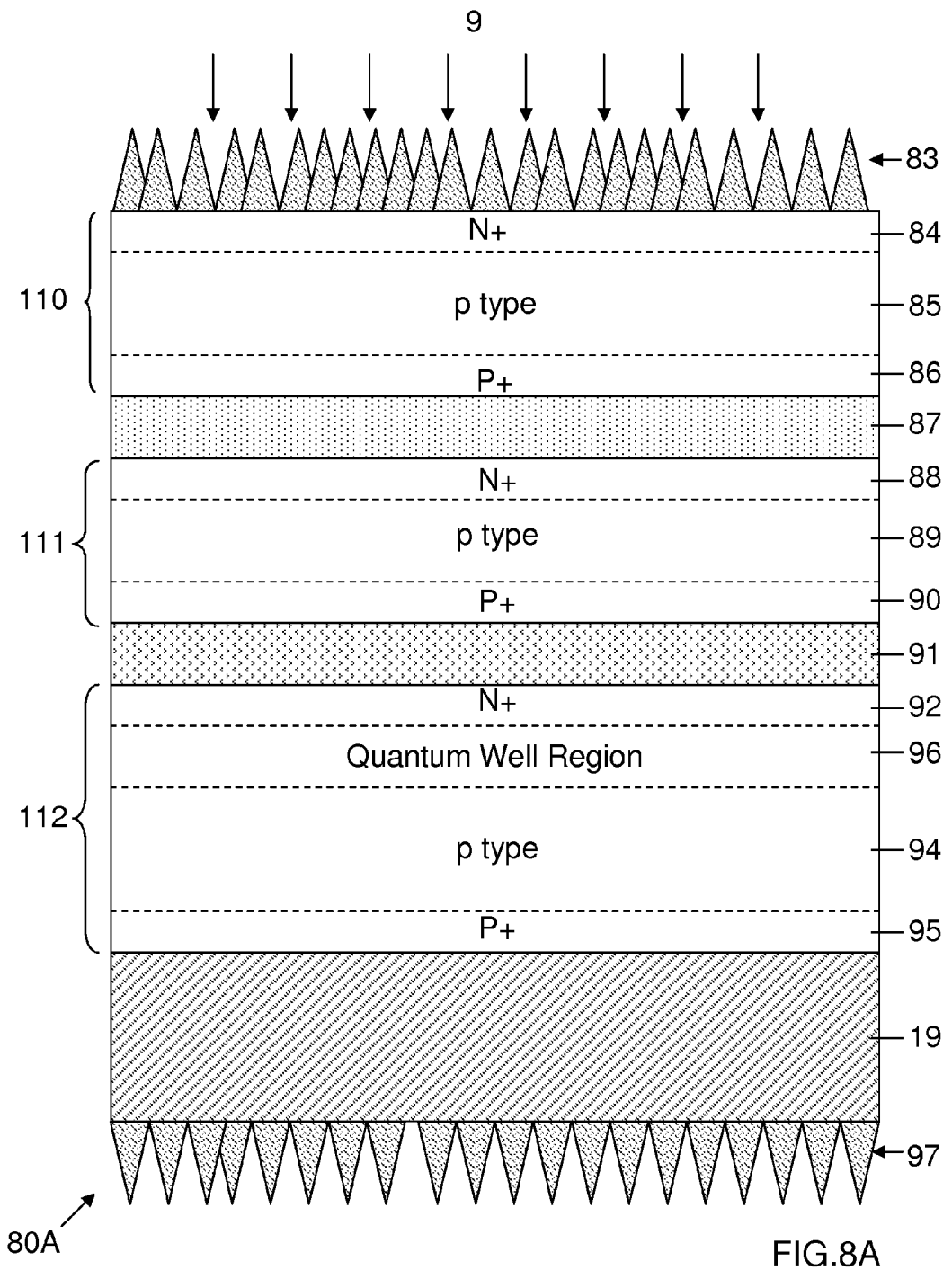
FIGS. 8A and 8B show photovoltaic energy conversion devices formed with tandem photovoltaic cells with surface texturing to trap radiant energy including light, quantum wells, and heterojunction or TCO interconnects made by wafer bonding.

FIG. 8A shows a tandem photovoltaic cell device 80A illuminated by radiant energy, e.g. sunlight 9, consisting of individual three stacked photovoltaic cells 110, 111, and 112. The top photovoltaic cell 110 has an upper N+ doped region 84 above a middle p-type doped region 85 which is above a lower P+ doped region 86. The lower P+ doped region 86 is bonded to the cell 111. The middle photovoltaic cell 111 has N+ doped region 88, p-type doped region 89, and P+ doped region 90. The bottom photovoltaic cell 112 has an upper N+ doped region 92 above a middle p-type doped region 94, which is above a lower P+ doped region 95. Interconnect interface regions 87 and 91 may be either tunnel junctions, heterojunctions, TCO's, or grid alloyed regions. A quantum well or quantum dot region 96 is included in the bottom photovoltaic cell 112. The material used to form the quantum well or quantum dots in region 96 has a lower bandgap than material #3 used to form the bottom photovoltaic cell 112.

The top surface 83 of top N+ layer 84 of the top photovoltaic cell 110 is rough-textured to reduce light reflection from the top surface and cause light trapping. Similarly, a rough-textured surface 97 is incorporated onto the bottom surface of the substrate 19 to cause additional light trapping if the substrate 19 is transparent. On the other hand, if the substrate 19 is metallic, it will reflect light that reaches it back upward into the photovoltaic cells and also adds to light trapping. If the substrate 19 is a semiconductor, e.g. silicon, the textured surface 97 is easily created by plasma or wet etching.

Photovoltaic cells 110, 111, and 112 may be thin films with thicknesses of from about 0.5 microns to about 10 microns; or the bottom photovoltaic cell 112 may be thick and mounted to substrate 19 by alloying, adhesive, or second metal layer alloying. A metal layer, not shown, can be applied on the surface of substrate 19 that will alloy with the bottom photovoltaic cell 112 during mounting even if the metal used for substrate 19 does not alloy with it. In addition, one or more layers of anti-reflective coating materials (not shown) may be added to the top of textured surface 83 to further reduce light reflection loss.

Figure 8B:
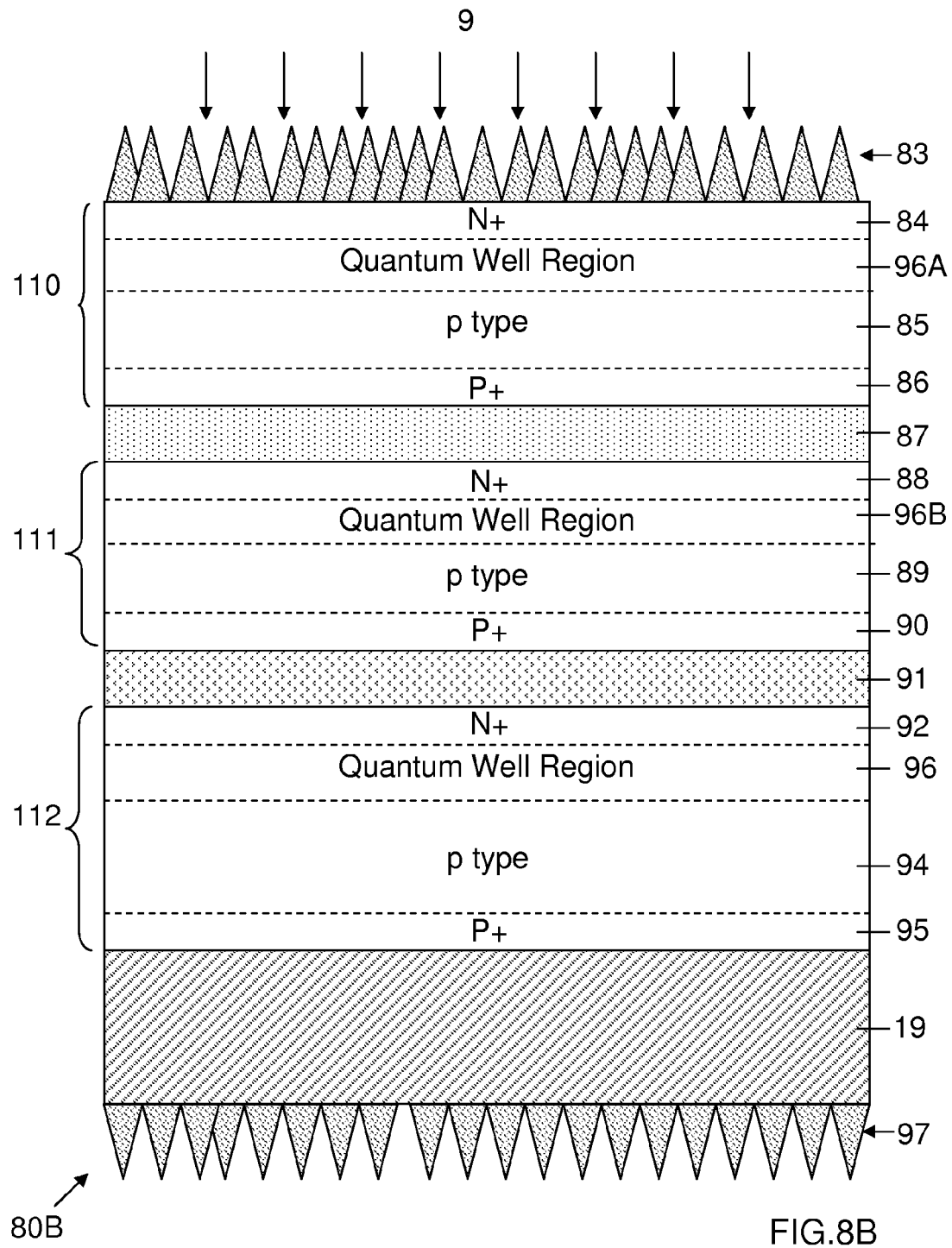

FIG. 8B shows a tandem photovoltaic cell device 80B in accordance with this invention (illuminated by radiant energy, e.g. sunlight 9) which is basically the same as FIG. 8A with the exception of a modification of the tandem photovoltaic cell device 80A of FIG. 8A with two additional quantum well or quantum dot regions 96A, 96B in the photovoltaic cells 110, 111 formed below the N+ regions 84 and 88 and the respective upper surfaces of the p type regions 85 and 89 below the N+ regions 84 and 88 respectively of the two stacked upper and middle photovoltaic cells 110 and 111 in addition to a quantum well region 96 in the lower photovoltaic cell 112. In each case the materials used in forming all of the several quantum wells or quantum dots 96A, 96B and 96 will have lower bandgaps than the host materials used to create photovoltaic cells 110, 111, and 112, respectively.

It is apparent to those skilled in the art that variations of the features outlined in the detailed description of the appended drawings can be made without deviating from the spirit of the invention. What is basic to the invention is the fabrication of thin film tandem, multijunction photovoltaic cells by separate photovoltaic cell formation and optimization with subsequent wafer bonding means to interconnect such thin film photovoltaic cells, together with the use of tunnel junctions, heterojunctions, transparent conductive oxides, or alloying grid metallurgy. The incorporation of light trapping and quantum wells enhances the performance of the thin film tandem photovoltaic cells, and the use of low cost substrate material reduces the overall cost of the devices.

The invention claimed is:

1. An energy conversion device comprising:
a stack of photovoltaic (PV) cells comprising an upper PV cell and a lower PV cell;
said upper PV cell having a lower surface and a higher energy bandgap than said lower PV cell;
said lower PV cell having an upper surface and an energy bandgap lower than that of said upper PV cell;
wherein at least one of said upper and lower PV cells comprises a quantum well or quantum dot region, and a N+/P/P+ doped layer stack comprising an N+ layer, a P layer and a P+ layer, wherein the quantum well or quantum dot region is disposed between and in contact with the N+ layer and the P layer and wherein the P layer directly contacts the P+ layer;
said stack including a mechanical and electrical interconnect interface between said lower surface of said upper PV cell and said upper surface of said lower PV cell in direct contact with both said lower surface of said upper PV cell and said upper surface of said lower PV cell; and
said mechanical and electrical interconnect interface structure comprising a metal grid between and alloyed to said upper PV cell and said lower PV cell.

2. The energy conversion device of claim 1 wherein said device is firmed on a substrate composed of a material selected from the group consisting of silicon, glass, quartz, silica, alumina, ceramic, metal, graphite, and plastic.

3. The energy conversion device of claim 1 wherein said lower PV cell comprises said quantum well or quantum dot region.

4. The energy conversion device of claim 1 wherein at least one of a top surface or a bottom surface of said energy conversion device comprises light-trapping means.

5. An energy conversion device comprising:
a plurality of photovoltaic (PV) cells including an upper PV cell, a middle PV cell and a lower PV cell with each of said PV cells comprising an individual, thin film separate semiconductor wafer including said upper PV cell wafer farmed with a first interconnect interface to said middle PV cell;
said middle PV cell formed with a second interconnect interface to said lower PV cell;
wherein at least one of said upper, middle, and lower PV cells comprises a quantum well or quantum dot region, and a N+/P/P+ doped layer stack comprising an N+ layer, a P layer and a P+ layer, wherein the quantum well or quantum dot region is disposed between and in contact with the N+ layer and the P layer and wherein the P layer directly contacts the P+ layer;
each of said first and second interconnect interfaces comprising a structure selected from the group consisting of an intermediate Transparent Conducting Oxide (TCO) layer, a heterojunction layer of a material with a close lattice match to said plurality of PV cells, and a metal grid; and
said lower PV cell being mounted on a substrate.

6. The energy conversion device of claim 5 wherein:
said upper PV cell has an energy bandgap of at least about 1.7 electron volts and is on top, said middle PV cell has a bandgap between about 1.2 electron volts and about 1.7 electron volts and is below said upper PV cell; and said lower PV cell has an energy bandgap below about 1.2 electron volts and is below said middle PV cell.

7. The energy conversion device of claim 5 wherein said substrate is composed of a material selected from the group consisting of silicon, glass, quartz, silica, alumina, ceramic, metal, graphite, and plastic.

8. The energy conversion device of claim 5 further comprising a light-trapping layer disposed on said upper PV cell of said energy conversion device.

9. The energy conversion device of claim 1 wherein:
said upper PV cell and said lower PV cell are arranged in a hierarchical stack of decreasing order of the energy bandgap thereof from top to bottom;
wherein said upper PV cell and said lower PV cell each have a thickness in the range from about 0.5 microns to about 10 microns;
wherein said hierarchical stack is mounted upon a thick substrate composed of a material selected from the group consisting of silicon, glass, quartz, silica, alumina, ceramic, metal, graphite, and plastic; and
wherein the energy conversion device further comprises a light trapping layer disposed on at least one of an upper surface and a lower surface of said energy conversion device.

10. The energy conversion device of claim 9 wherein both of said upper and lower PV cells comprise a quantum well or quantum dot region.

11. The energy conversion device of claim 1 wherein said metal grid comprises an alloying metal.

12. The energy conversion device of claim 1 wherein:
said upper PV cell has an energy bandgap of at least about 1.7 electron volts; and
said lower PV cell has an energy bandgap between about 1.2 electron volts and about 1.7 electron volts.

13. The energy conversion device of claim 12 further comprising a first light-trapping layer disposed on the top surface of said energy conversion device and a second light-trapping layer disposed on the bottom surface thereof.

14. The energy conversion device of claim 9 wherein said metal grid comprises an alloying metal.

15. The energy conversion device of claim 9 wherein:
said upper PV cell has an energy bandgap of at least about 1.7 electron volts; and
said lower PV cell has an energy bandgap between about 1.2 electron volts and about 1.7 electron volts.

16. The energy conversion device of claim 15 further comprising a first light-trapping layer disposed on said upper surface of said energy conversion device; and
a second light-trapping layer disposed on said lower surface of said energy conversion device.

17. An energy conversion device comprising:
photovoltaic (PV) cells including an upper PV cell, and a lower PV cell with each of said upper and lower PV cells comprising an individual, thin film separate semiconductor wafer;
said upper PV cell formed with an interconnect interface to said lower PV cell;
wherein at least one of said upper and lower PV cells comprises a quantum well or quantum dot region, and a N+/P/P+ doped layer stack comprising an N+ layer, a P layer and a P+ layer, wherein the quantum well or quantum dot region is disposed between the N+ layer and the P layer and wherein the P layer directly contacts the P+ layer;
said interconnect interface comprising a layer composed of a heterojunction material with a close lattice match to said upper and lower PV cells;
wherein for a said upper and lower PV cells composed of Ge or GaInAs said heterojunction material is selected from the group consisting of GaAs, GaAlAs and ZnSe;
wherein for a said upper and lower PV cells composed of silicon said heterojunction material is selected from the group consisting of GaAsP, GaP, and ZnS;
wherein for a said upper and lower PV cells composed of GaAs said heterojunction material is selected from the group consisting of GaInP and GaAlAs; and
wherein for a said upper and lower PV cells composed of GaInP said heterojunction material comprises AlInP.

* * * * *